US005607816A

United States Patent [19]

Fitzgerald et al.

[11] Patent Number: 5,607,816
[45] Date of Patent: Mar. 4, 1997

[54] ON-PRESS DEVELOPABLE LITHOGRAPHIC PRINTING PLATES WITH HIGH PLASTICIZER CONTENT PHOTORESISTS

[75] Inventors: Maurice J. Fitzgerald, Canton; John M. Hardin, Jamaica Plain; Frederick R. Kearney, Walpole; Rong-Chang Liang, Newton, all of Mass.

[73] Assignee: Polaroid Corporation, Cambridge, Mass.

[21] Appl. No.: 531,853

[22] Filed: Sep. 21, 1995

Related U.S. Application Data

[63] Continuation-in-part of Ser. No. 147,044, Nov. 1, 1993, abandoned.

[51] Int. Cl.$^6$ ........................................ G03F 7/30
[52] U.S. Cl. .................. 430/271.1; 430/302; 430/278.1; 430/281.1; 101/451; 101/456
[58] Field of Search ................................. 101/451, 456; 430/302, 278.1, 271.1

[56] References Cited

U.S. PATENT DOCUMENTS

| | | | |
|---|---|---|---|
| 3,469,982 | 9/1969 | Celeste | 430/278.1 |
| 3,549,367 | 12/1970 | Chang et al. | 430/278.1 |
| 3,784,378 | 1/1974 | Gramas | 430/328 |
| 4,055,430 | 10/1977 | Hasegawa et al. | 96/90 |
| 4,147,549 | 4/1979 | Held | 430/302 X |
| 4,162,162 | 7/1979 | Dueber | 96/115 |
| 4,264,708 | 4/1981 | Chambers et al. | 430/278.1 |
| 4,273,851 | 6/1981 | Muzyczko et al. | 430/175 |
| 4,284,710 | 8/1981 | Burg | 430/271.1 |
| 4,408,532 | 10/1983 | Incremona | 101/456 |
| 4,629,680 | 12/1986 | Iwasaki et al. | 430/281.1 |
| 5,258,263 | 11/1993 | Cheema et al. | 430/300 |
| 5,368,973 | 11/1994 | Hasegawa | 430/138 |
| 5,395,734 | 3/1995 | Vogel et al. | 430/270 |

FOREIGN PATENT DOCUMENTS 1482665  8/1977  United Kingdom.

OTHER PUBLICATIONS

Cunningham et al. "Polymer imaged lithographic printing plate"; 12027, *Research Disclosure*, Apr. 1974, pp. 13–14.

Cohen, A. B., and Walker, P. 1989. *Image Processing and Materials: Neblette's Eighth Edition*. Chap. 7, "Polymer Imaging." Van Nostrand Reinhold, New York, pp. 223, 238.

*Primary Examiner*—Cynthia Hamilton
*Attorney, Agent, or Firm*—Renato M. de Luna

[57] ABSTRACT

Described is the use of a plasticizing-permeation enhancing additive in negative-working, on-press developable lithographic printing plates. Briefly, a plasticizer, which is dispersible or soluble in press fountain and ink solutions and soluble in acrylic monomers and oligomers, are incorporated into a plate's photoresist at concentrations sufficient to enhance said resist's permeability to or diffusion by press solutions. Such additives make the photoresist more permeable to fountain solution prior to crosslinking, while being easily extracted with ink and fountain solution after crosslinking. In certain embodiments, a surfactant is added to facilitate the dispersion of hydrophobic remnants of removed resist material in the fountain solution, and thereby reduce scumming. Lithium salts may also be incorporated into the photoresist to disrupt hydrogen bonding of, for example, urethane acrylate polymers which tend to associate by hydrogen bonding.

17 Claims, No Drawings

ON-PRESS DEVELOPABLE LITHOGRAPHIC PRINTING PLATES WITH HIGH PLASTICIZER CONTENT PHOTORESISTS

REFERENCE TO PARENT APPLICATION

This application is a continuation-in-part application of U.S. patent application Ser. No. 08/147,044, filed Nov. 1, 1993, now abandoned.

FIELD OF THE INVENTION

In general, the present invention relates to plasticizing-permeation enhancing additives for on-press developable lithographic printing plates, and more particularly, the use of plasticizers, surfactants, and lithium salts to effectuate enhanced developability of polymeric photoresist layers utilized for negative-working on-press developable lithographic printing plates.

CROSS-REFERENCE TO RELATED PATENT APPLICATIONS

U.S. Pat. No. 5,516,620 issued to L.C. Wan, A. C. Giudice, J. M. Hardin, C M. Cheng, and R. C. Liang, on May 14, 1996, describes a lithographic printing plate for use on a printing press, with minimal or no additional processing after exposure to actinic radiation. The plate comprises a printing plate substrate, a polymeric resist layer capable of imagewise photodegradation or photohardening, and a plurality of microencapsulated developers capable of blanketwise promoting the washing out of either exposed or unexposed areas of the polymeric resist. The microencapsulated developers may be integrated into the polymeric resist layer, or may form a separate layer deposited atop the polymeric resist layer, or may be coated onto a separate substrate capable of being brought into face-to-face contact with the resist layer.

U.S. Pat. No. 5,514,522 issued to W. C. Schwarzel, F. R. Kearney, M. J. Fitzgerald, and R. C. Liang, on May 7, 1996, describes a photoreactive polymeric binder that may be used to enhance photospeed in either conventional plates or on-press developable lithographic printing plates. Briefly, a polymer of m-isopropenyl-α,α-dimethylbenzyl isocyanate is derivatized for vinyl group reactivity by reacting the isocyanate groups thereof with a hydroxyalkyl acrylate, such as 4-hydroxybutyl acrylate. The resulting photopolymeric binder provides higher photospeed than compositions containing non-reactive binders typically utilized in the production of printing plates. Lithographic printing plates utilizing the photoreactive polymeric binder have good durability (as manifested by good run-length) and can be developed using relatively weak developers. As to the preparation of the photoreactive binders, the applications describe a method of copolymerizing m-isopropenyl-α,α-dimethylbenzyl isocyanate through complexation with an electron-deficient monomer such as maleic anhydride to accelerate free radical copolymerization with other monomers. The maleic anhydride accelerated process is kinetically more efficient and provides greater monomer-to-polymer conversion. Use of the resulting product in the photoresist of a lithographic printing plate improves its adhesion.

U.S. patent application Ser. No. 08/146,479 of L.C. Wan, A. C. Giudice, W. C. Schwarzel, C. M. Cheng, and R. C. Liang, filed Nov. 1, 1993, commonly assigned, and titled "Lithographic Printing Plates with Dispersed Rubber Additives", describes the use of rubbers and surfactants to enhance the durability of on-press developable printing plates. The rubbers are preferably incorporated into a photoresist as discrete rubber particles. To ensure a uniform and stable dispersion, the rubber components are suspended in the photoresist preferably by means of surfactants having HLBs approximately between 7.0 and 18.0.

The disclosures of the aforementioned applications are hereby incorporated by reference.

BACKGROUND OF THE INVENTION AND DESCRIPTION OF THE PRIOR ART

At the present time, virtually all printed copy is produced through the use of three basic types of printing plates. One type is a relief plate which prints from a raised surface. Another type is an intaglio plate which prints from a depressed surface. The third type is the lithographic plate which prints from a substantially flat surface which is neither appreciably raised above nor appreciably depressed below the adjacent and surrounding non-printing areas. Printing is occasioned by an ink's respective affinity and/or aversion to areas of different chemical properties. Lithographic printing plates are commonly processed to have water-repellent (hydrophobic), oil-receptive (oleophilic) image areas and waterreceptive (hydrophilic) non-image areas.

Prior to processing for use, conventional lithographic plates will typically have a hydrophobic, photoreactive polymeric layer (i.e. photoresist) coated or otherwise deposited atop a hydrophilic substrate.

In preparing a conventional lithographic plate for use on a printing press, the plate is first exposed to actinic radiation. Specific chemical reactions are caused to occur in the plate's photoresist by exposure to actinic radiation. Such photoinduced chemical reactions may either reduce or enhance the solubility of the photoresist, depending on whether the resist is negative-working or positive- working. In negative-working plates, exposure to actinic radiation will generally cause a "hardening" of the photoresist. In positive-working plates, exposure to actinic radiation will generally cause a "softening" or "solubilization" of the photoresist.

After photoexposure, a wet development step is normally conducted. The objective of such wet development is to provide preferential solvation of the areas of the photoresist which have undergone photoinduced chemical change. Solvation under conventional development techniques will typically involve treating the exposed plate with organic solvents in a developing bath. For negative-working resists, the solvent will swell and dissolve the unexposed portions of the resist. The solvent should not swell the exposed portions or distortion of the developed image may result. For positive-working resists, the response of the unexposed and exposed coatings are reversed, but the same general principles apply.

As a result of the preferential solvation and washing away of portions of the photoresist, corresponding portions of the underlying hydrophilic substrate are uncovered. For negative-working plates, the aforementioned hydrophobic image areas correspond to the portions of the photoresist remaining after solvation and washing. The aforementioned hydrophilic non-image areas correspond to uncovered portions of the substrate. The image and non-image areas thus differentiated, the processed plate may then be mounted onto a printing press and run.

Encumbered by required wet development, the processing of conventional lithographic plates prior to their use on a printing press is time and labor consuming and involves the use of substantial quantities of organic chemicals. It will be appreciated that there is considerable attractiveness for innovations that would satisfactorily eliminate or reduce conventional lithography's long-felt dependency upon the conduct of bath development and thereby permit the use of lithographic plates on a printing press immediately after exposure without required intermediary processing.

In the past, dry-developable lithographic printing plates have been suggested which enable the wet processing steps of lithographic printing plates after exposure to be omitted and printing to be conducted by directly mounting the exposed plates on a printing press. Among printing plates that may be characterized as "on-press" developable (or related thereto) are: e.g., U.S. Pat. No. 4,273,851, issued to Muzyczko et al. on Jun. 16, 1981; U.S. Pat. No. 5,258,263, issued to Z. K. Cheema, A. C. Giudice, E. L. Langlais, and C. F. St. Jacques on Nov. 2, 1993; and U.S. Pat. No. 5,395,734, issued to Vogel et al. on Mar. 7, 1995.

Despite the methodologies and approaches embodied in the aforementioned patents, there is a continuing need for a lithographic printing plate that can be readily developed on a printing press and that produces a plate having durable image areas needed for good run length. Difficulty in the realization simultaneously of both "on-press developability" and "durability" is believed to originate from an apparent contradiction between photoresist removability ("developability") on the one hand and "durability" on the other: To make a photoresist more durable was to make the photoresist less developable.

The ramifications of the "durability/developability dilemma" are of little practical consequence to conventional plates which are not designed for on-press development. For such plates development and use will generally occur in separate stages. Accordingly, such plates will normally be treated first with a non-polar solvent developer or with an aqueous alkaline developer, and then, with aqueous acid fountain solutions during use on a printing press. The use of a developer whose solubility characteristics are dramatically different from the printing press use environment allows conventional resists to be formulated, for example, with wet-adhesion promoting functional groups or additives having different solubility characteristics depending on the relative alkalinity or acidity of its environment.

Certain problems arise in designing an "on-press" developable lithographic plate because the bath development environment associated with conventional plate development and the environmental conditions existing on a printing press for "on-press" plate development are different. If the photoresist is easily developed by the press fountain and ink solutions, swelling and the concomitant undercutting of the resist layer will occur due to the continued presence of such solutions during "use". Thus, in designing a practical and effective "on-press" developable lithographic printing plate, need arises for a mechanism whereby the solubility characteristics of the photoresist may be controlled for on-press development of the plate by fountain and ink solutions, without unacceptable compromise of the durability of the plate and the capacity of the plate to perform satisfactorily during continued use on the press.

Since it is impractical to modify the ink and fountain solutions of printing presses to accommodate "on press" developable plates, the present invention seeks to incorporate into photoresists a unique plasticizing system having components miscible with both the components of the host photoresist and typical fountain/ink solutions. In one aspect, the plasticizing systems are formulated to efficiently plasticize the photoresist to thereby enhance developability by facilitating fast diffusion of the fountain and ink solution into the photoresist. In a second aspect, the plasticized photoresist is also formulated to be dispersible or moderately soluble in typical fountain/ink combinations. Since the photoresist itself will typically have a low affinity toward the fountain and ink solutions, as the plasticizer is gradually leached out by the fountain/ink during plasticizer-enhanced development, the photoresist is concurrently converted gradually from a fountain/ink developable state to a fountain/ink resistant state. To this end, the present invention provides a plasticizing-permeation enhancing system generally comprising plasticizers with select solubility characteristics and, in certain embodiments, surfactants and, in still other embodiments, lithium salts. Properly composed, the durability of printing plates utilizing such plasticizing systems will not be compromised in exchange for enhanced developability.

SUMMARY OF THE INVENTION

The present invention provides several methods and compositions relating to the use of plasticizers, surfactants and lithium salts as added components in the photoresists of lithographic printing plates designed to be developed immediately after exposure on the press without a chemical developing step. The photoresist of such plates, typically a photopolymerizable oleophilic layer, comprises one or more polymeric binders, one or more crosslinkable monomers or urethane acrylate oligomers, and an initiator system.

The plasticizers used in the present invention are dispersible or soluble in the acrylic monomers and oligomers used in the photoresist layer as well as dispersible or soluble in printing press fountain and ink solutions. Added in an unprecedented high concentration, the plasticizer make the photoresist more permeable to or diffusible by fountain solution prior to crosslinking, while being easily extracted with ink and fountain solution after crosslinking. In certain embodiments, these permeation enhancing plasticizers may be combined with surfactants. The surfactants improve the miscibility of the plasticizer in both the resist composition and fountain solution, thus permitting reduced (although still comparatively high) concentrations of plasticizers. In still further embodiments, the plasticizers, alone or in combination with a surfactant, may be combined with lithium salts. Operating within the plasticizing-permeation enhancing system, the lithium salts act to break up the hydrogen bonding of, for example, urethane acrylate polymers which tend to associate by hydrogen bonding, thus, enhancing the developability of the photopolymerizable layer, especially of an aged layer. The lithium salts also appear to enhance photospeed.

It is a primary, general objective of the present invention to enhance the developability of an "on press" developable printing plate without compromising durability.

It is another object of the present invention to provide a lithographic printing plate developable on a lithographic printing press equipped with means for delivering lithographic ink and aqueous fountain solutions to the printing plate, the lithographic printing plate having in order (a) a hydrophilic, oleophobic printing plate substrate; and (b) a hydrophobic, oleophilic, organic solvent-deposited photoresist photohardenable upon imagewise exposure to actinic radiation, the photoresist comprising (i) a water-insoluble macromolecular organic binder; (ii) a photopolymerizable ethylenically unsaturated monomer having at least one terminal ethylenic group capable of forming a high polymer by chain-propagated polymerization, (iii) a polymerization initiator activatable by actinic radiation, and (iv) a plasticizing-permeation enhancing additive in a concentration sufficient to enhance penetration or diffusion of lithographic ink and aqueous fountain solutions into non-photohardened areas of the photoresist when the photoresist is imagewise exposed and said solutions are delivered to the printing plate by said means in said lithographic printing press, the plasticizing-permeation enhancing additive having a solubility or dispersibility in said acidic aqueous fountain solution such that the additive is also capable of being contemporaneously leached out of photohardened areas of the photoresist by said solutions delivered to the printing plate by said means in said lithographic printing press, the plasticizing-permeation enhancing additive having a Hildebrand Solubility value between approximately 10 $[cal/cm^3]^{1/2}$ and approximately 23 $[cal/cm^3]^{1/2}$.

It is another object of the present invention to provide a method of lithographically printing images on a receiving medium, the method utilizing a printing press equipped with means for delivering lithographic ink and aqueous fountain solutions to a printing plate mounted therein, the method comprising in order the steps of: (a) incorporating a plasticizing-permeation enhancing additive into an organic solvent-based photoresist composition, wherein (i) the organic solvent-based photoresist composition comprises a water-insoluble macromolecular organic binder; a photopolymerizable ethylenically unsaturated monomer having at least one terminal ethylenic group capable of forming a high polymer by chain-propagated polymerization, and a polymerization initiator activatable by actinic radiation, and (ii) the plasticizing-permeation enhancing additive is incorporated in a concentration sufficient to enhance penetration or diffusion of lithographic ink and aqueous acidic fountain solutions into non-photohardened areas of a resulting photoresist when said solutions are delivered to the printing plate by said means in said lithographic printing press, the plasticizing-permeation enhancing additive having a solubility or dispersibility in said acidic aqueous fountain solution such that the additive is also capable of being contemporaneously leached out of photohardened areas of the photoresist by said solutions delivered to the printing plate by said means in said lithographic printing press, the plasticizing-permeation enhancing additive having a Hildebrand Solubility value between approximately 10 $[cal/cm^3]^{1/2}$ and approximately 23 $[cal/cm^3]^{1/2}$; (b) depositing the photoresist composition onto a hydrophilic, oleophobic lithographic printing plate substrate, to provide thereon a hydrophobic, oleophilic photoresist capable of being photohardened upon imagewise exposure to actinic radiation; (c) imagewise exposing the photoresist to actinic radiation to cause the photopolymerizable monomer in exposed areas to polymerize and thereby cause exposed areas of the photoresist to imagewise photoharden, unexposed areas being removable by press fountain and ink solutions; then (d) treating the photoresist with lithographic ink and aqueous fountain solutions in said printing press, wherein the ink and fountain solutions penetrate or diffuse into the photoresist to thereby effect removal of non-photohardened areas of the photoresist correspondingly baring the underlying substrate, and wherein the ink and fountain solutions leach out the plasticizing-permeation enhancing additive in photohardened areas contemporaneously with said removal of said non-photohardened areas, and whereby ink becomes imagewise localized in either unremoved photoresist or bared substrate to form an imagewise distribution of said ink, said ink being transferable to a receiving medium.

DETAILED DESCRIPTION OF THE INVENTION

Throughout this disclosure the term "on-press" is used to describe both development and printing plates, (e.g. "on-press development", "developing on-press", "on-press developable lithographic printing plates", etc.) As used herein, the modifier "on-press" will be defined as indicating an ability to develop a useful imagewise distribution of oleophilic and hydrophobic polymeric areas on a printing press after imagewise exposure, without resort to wet development steps or like intermediary processing. "On-press" techniques should be contrasted with other so-called "dry development" techniques: e.g., dry collotype and laser ablation techniques, wherein oleophilic and hydrophobic image areas are formed at exposure; and peel-apart and thermal transfer techniques, wherein oleophilic and hydrophilic image areas are formed after a laminar separation.

Further, it will be appreciated that the term "plasticizer" as used herein should be construed with regard to its function as disclosed herein (e.g., plasticizing-permeation enhancing agents), and in contrast to the traditional use of such species (i.e., plasticizing agents) from which the term originates. In consideration of such distinction, the alternative term "plasticizing-permeation enhancing additive" is used in the claims for greater clarity. Regardless, the subject matter intended to be encompassed by either term is identical.

Embodiments of the present invention provide a plasticizing-permeation enhancing system for use in photoresist compositions coated on "on press" developable lithographic printing plates. The plasticizing-permeation enhancing system will generally comprise plasticizers together with surfactants and lithium salts. Aside from the plasticizing-permeation enhancing system, the photoresist will also typically comprise a polymeric binder and a photopolymerizable, photocrosslinkable, or photorearrangeable compound, typically photopolymerizable monomers and/or oligomers and an initiator system.

The plasticizers are chosen so as to be substantially dispersible or soluble in press fountain solutions, and substantially soluble in the photoresist composition. Contrasted with the conventional use of plasticizers to improve flexibility, plasticizers are used in the present invention in concentrations sufficient to make photoresists more permeable to fountain solution prior to crosslinking, while being easily extracted with ink and fountain solution after crosslinking. In operation, the non-crosslinked areas of the photoresist (i.e., unexposed areas in negative-working plates) are easily developed because of the presence of hydrophilic plasticizers. However, as the plate's run is continued on the press, the plasticizers are gradually extracted out of crosslinked areas of the photoresist (i.e., exposed areas in negative-working plates) due to their solubility in fountain solution and the crosslinked area becomes more hydrophobic. The leaching out of the plasticizers from the cross-linked areas promotes the long-term durability of the plates throughout its run.

In view of its unique function in the host photoresist, the plasticizer used for the present invention is carefully scrutinized for precise solubility characteristics. In this regard, the plasticizer should have a Hildebrand solubility parameter between that of most urethane and acrylic polymers (approx. 10 $[cal/cm^3]^{1/2}$) and that of water (approx. 23 $[cal/cm^3]^{1/2}$). Such "bracketed" solubility makes the plasticizer both soluble in the photoresist composition and dispersible or soluble in the fountain solution. In addition to the solubility characteristics, the plasticizer should be also capable of facilitating the emulsification and removal of the unexposed portions of the image coat by fountain solution, thereby enhancing the developability of the photoresist, and secondly, must be extractable from the crosslinked portions of the photoresists, thereby maintaining the durability of the photoresist. When utilizing plasticizer alone, the preferred concentration is from approximately 5% to 15% by weight dry film. Examples of suitable plasticizer include but are not limited to 1,2,6-trihydroxyhexane (THH), triethylene glycol diacetate (3EGDA), tetraethylene glycol diacetate (4EGDA), tetraethylene glycol dipropionate (4EGDP), Plasthall 7050 (dialkylalkylene glutarate, from C. P. Hall Co.), Tegmer 809 (polyethylene glycol di-2-ethylhexoate, from BASF Co.), 1,2,4-trihydroxybutane, trimethylolpropane triacetate, and combinations thereof. THH and 3EGDA are preferred. The plasticizer may be added in concentrations ranging from 2% to 10% by weight dry film.

It is envisioned that the plasticizing-permeation enhancing additive could be a blend of two or more plasticizers, and that such blend may perform in a synergistically superior fashion than any one of the plasticizers would indicate. Likewise, the individual plasticizers by themselves may not necessarily behave in the desired fashion when employed separately, but only when used as a blend.

Further, it will be appreciated that when the plasticizing-permeation enhancing species is added in a concentration sufficient to enhance diffusion or penetration of lithographic ink and fountain solutions into the resultant photoresist, a comparatively tacky lithographic printing plate is obtained. To counter the "tackiness" of the printing plate, and thereby promote durability and ease of handling, the deposition of a protective, yet on-press removable, overcoat onto the photoresist is highly desirable. An example of a useful overcoat would be one comprising fountain soluble or dispersible sucrose crystals in a polyvinyl alcohol matrix. A quencher may also be added to regulate or otherwise control the detrimental and undesired activity of free-radicals which—due to the isolation of the photoresist from ambient oxygen by the overcoat—may occur subsequent to imagewise exposure. These and other useful overcoats are described in detail in pending, commonly owned, U.S. patent application Ser. Nos. 08/430,359 and 08/430,876.

Although still comparatively higher than conventional concentration of plasticizer, the plasticizer concentrations required by this method may be reduced by the addition of surfactants. When utilizing a combination of surfactants and plasticizers, the preferred concentration of plasticizer is from about 3% to about 6% by weight. It is noted that the surfactants will not only facilitate the dispersion of the hydrophobic imaging compositions in the fountain solution, but will also effectuate the reduction of scumming. Examples of suitable surfactants include but are not limited to Pluronic L43 and Tetronic 10-R5 (both block copolymers of ethylene oxide and propylene oxide, from BASF), nonylphenol-ethyleneoxide condensates, octyphenol -ethyleneoxide condensates, ethyleneoxide-propylene-oxide block copolymers, dodecanol-ethyleneoxide condensates, and combinations thereof. Surfactants having an HLB value between 8 and 15 may be utilized, however those with an HLB value between 9 and 13, such as Pluronic L43, are preferred. Surfactant may be added in concentrations ranging from approximately 0.5% to 0.6%, and preferably, from 1% to 3%.

In addition to the possibility of adding surfactants, the plasticizing-permeation enhancing system may also be improved by the addition of lithium salts that are soluble (or miscible) in both fountain solution and organic materials utilized in the photoresist composition. The lithium salts may be added with or without a surfactant component. Operating within the plasticizing-permeation enhancing system, lithium salts will provide better shadow "cleanout", improve the shelf-life of the image coat, and are believed to enhance photospeed. Within the plasticizing-permeation enhancing system, it is also believed that lithium salts act to break up the hydrogen bonding of, for example, urethane acrylate polymers which tend to associate by hydrogen bonding, thus enhancing the developability of the photopolymerizable layer, especially of an aged layer. Examples of useful lithium salts are lithium chloride, lithium nitrate, lithium perchlorate, lithium tetraphenyl borate, and combinations thereof. For free-radical based photoresists, lithium chloride is preferred over lithium nitrate to the extent that nitrate salt and its impurity are believed to retard free-radical crosslinking reactions. If used, lithium salts may be added in concentrations ranging from greater than 0% to approximately 2.0%, and preferably, from 0.3% to 1.0%.

As indicated above, the plasticizing-permeation enhancing system, will be incorporated into a photoresist composition that is deposited onto a substrate to form a lithographic printing plate. As stated, such photoresist composition will typically comprise a photopolymerizable monomer, a polymeric binder and an initiator system. The photoresist is prepared from a photoresist composition comprising the stated ingredients in an organic solvent, such as methyl ethyl ketone. As a solvent-based resist, when developed on-press, remnants of the removed resist will be "taken up" by the press ink solution. Accordingly, contamination of the press fountain solution (and the concomitant degradation of print quality) is avoided.

The polymerizable monomer component may include, any variety of compounds, mixtures, or mixtures of reaction compounds or materials capable of being physically altered by photoexposure or of promoting physical alteration (e.g. insolubilization or hardening) of the properties of the layer in areas of photoexposure. Compounds and materials suitable for this purpose include monomeric photopolymerizable compounds which undergo free-radical or cation-initiated addition polymerization. A large number of useful compounds is available, generally characterized by a plurality of terminal ethylenic groups.

Especially preferred for promoting photohardening of polymeric resist layer is a polymerizable monomer which forms a macromolecular or polymeric material upon photoexposure, preferably a photopolymerizable ethylenically unsaturated monomer having at least one terminal ethylenic group capable of forming a high polymer by free-radical or cation-initiated, chain-propagated addition polymerization. Examples of such unsaturated compounds include acrylates, acrylamides, methacrylates, methacrylamides, allyl compounds, vinyl ethers, vinyl esters, N-vinyl compounds, styrene, crotonates and the like. Polymerization can be effected by using a photoinitiator, such as a free-radical generating, addition polymerization-initiating system activatable by actinic radiation. Such initiating systems are known and examples thereof are described below.

Preferred polymerizable monomers are the polyfunctional acrylate monomers, such as the acrylate and methacrylate esters of ethylene glycol, trimethylolpropane and pentaerythritol. These can be polymerized in exposed regions of a polymeric photoresist in the presence of a photoinitiator. Suitable photoinitiators include the derivatives of acetophenone (such as 2,2-dimethoxy-2-phenylacetophenone), benzophenone, benzil, ketocoumarin (such as 3-benzoyl-7- methoxy coumarin), xanthone, thioxanthone, benzoin or an alkyl-substituted anthraquinone, diaryl iodonium salt, triaryl sulfonium salts, azobisisobutyro-nitrile and azo-bis-4-cyano-pentoic acid, although others can be employed.

The practical concentration of the monomer or monomers employed is about 7.5%–70% by weight based on the total solids of the composition, and preferably between 15–40%.

In contrast to the comparatively low preferred concentrations of photosensitive monomer, the principal component of the polymeric photoresist for most plates is a hydrophobic layer of suitable oleophilicity and ink receptivity. Suitable binder materials include: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose esters and ethers (e.g., cellulose acetate butyrate, cellulose acetate propionate, and methyl, ethyl benzyl cellulose); synthetic rubbers (e.g., butadiene/acrylonitrile copolymers; chlorinated isoprene and 2-chloro-1,3-butadiene polymers); polyvinylesters (e.g. vinyl acetate/acrylate copolymers, poly(vinyl acetate) and vinyl acetate/methylmethacrylate copolymers); acrylate and methacrylate copolymers (e.g., polymethylmethacrylate); vinyl chloride copolymers (e.g., vinyl chloride/vinylacetate copolymers); and diazo resins such as the formaldehyde polymers and copolymers of p-diazo-diphenylamine.

The photoresist systems of the present invention can be suitably coated into a layer which, upon photoexposure, undergoes hardening as the result of polymerization of the polymerizable monomer and grafting of the monomer onto the polymeric binder. If desired, other crosslinking agents, such as bis-azides and polythiols, can be included to promote crosslinking of the polymerizable monomers or the binders.

If desired, preformed polymers having pendant pyridium ylide groups, which groups, upon photoexposure, undergo ring expansion (photorearrangement) to a diazepine group with accompanying insolubilization can also be blended with the photoreactive polymer of this invention. Examples of polymers having such pyridium ylide groups are set forth in U.S. Pat. No. 4,670,528, issued to L.D. Taylor and M.K. Haubs on Jun. 2, 1987.

To prepare a lithographic plate according to the present invention, the photoresist system is coated as a layer onto a substrate. Certain factors are considered in determining the appropriate materials for the substrate. Such factors vary with the particular lithographic needs of individual projects and are believed to be within the grasp of one skilled in the pertinent art. Regardless, for most lithographic needs envisioned, suitable substrates will generally include those to which the polymeric resist layer can be adhered adequately, prior to photoexposure, and to which photoexposed printing (image) areas are adhered after photoexposure. Other pertinent considerations may be extrapolated on the basis of the present disclosure.

In practice, substrate materials for use in the manufacture of printing plates will oftentimes be subjected to one or more treatments in order to improve adhesion of photoresist, or to increase the hydrophilic properties of the substrate material, and/or to improve the developability of the photoresist, as is described in the U.S. Pat. No. 4,492,616 (issued Jan. 8, 1985 to E. Pliefke, et al.). Thus, the substrates will typically be treated (for example, by polyvinylphosphonic acid or silicate or by anodization, or by corona discharge or plasma treatment, or by roughening or graining treatment) to promote desired adhesion of any polymeric resist layers.

Especially preferred substrates are the metallic substrates of aluminum, zinc, steel or copper. These include the known bi-metal and tri-metal plates such as aluminum plates having a copper or chromium layer; copper plates having a chromium layer; steel plates having copper or chromium layers; and aluminum alloy plates having a cladding of pure aluminum. Other preferred substrates are silicone rubbers and metallized plastic sheets such as poly(ethylene terephthalate).

Preferred plates are the grained, anodized aluminum plates, where the surface of the plate is roughened mechanically or chemically (e.g., electrochemically) by a combination of roughening treatments. Anodized plates can be used to provide an oxide surface. Still more preferred plates are anodized aluminum plates which, for example, have been treated with polyvinylphosphonic acid or otherwise provided with a resinous or polymeric hydrophilic layer.

Examples of printing plate substrate materials which can be used in the production of printing plates of the invention, and methods of graining and hydrophilizing such substrates are described, for example, in U.S. Pat. No. 4,153,461 (issued May 8, 1979 to G. Berghäuser, et al.); the aforementioned U.S. Pat. No. 4,492,616 issued to E. Pliefke, et al.; U.S. Pat. No. 4,618,405 (issued Oct. 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefke).

It is common practice in preparing photoresist compositions to employ photosensitizers, coinitiators, and activators. Photosensitizers and coinitiators are relied upon to capture photons of exposing radiation. They may absorb light of different wavelengths from the principal photoinitiator. The activator in contrast is not relied upon to respond directly to exposing radiation, but rather adjacent activator and photosensitizer molecules react, following excitation of the latter by photon capture, causing release of a free radical which in turn induces immobilization addition reactions at sites of ethylenic unsaturation.

Photoexposure of the printing plates can be accomplished according to the requirements dictated by the particular composition of the polymeric photoresist and the thickness thereof. In general, actinic irradiation from conventional sources can be used for photoexposure, for example, relatively long wavelength ultraviolet irradiation or visible irradiation. UV sources will be especially preferred and include carbon arc lamps, "D" bulbs, Xenon lamps and high pressure mercury lamps.

The thickness of the photoresist can vary with the particular requirements. In general, it should be of sufficient thickness to provide a durable photohardened printing surface. Thickness should be controlled, however, such that it can be exposed within exposure-time requirements and should not be applied at a thickness that hampers ready removal of the layer in non-exposed areas by developers. When utilizing an anodized, grained aluminum substrate, good results are obtained by using a polymeric photoresist having a thickness in the range of from about 0.2 microns to about 3 microns above the microstructure of the grains, preferably about 0.2 to 0.6 microns "above the grain".

A polymeric photoresist can be provided with colorants, e.g., tint dyes, to provide a desired and predetermined visual appearance. Especially preferred will be a colorant or a precursor of a species, respectively, capable either of being rendered colorless, or being provided with coloration by the irradiation of the plate-making photoexposure step. Such dye or dye-precursor compounds and the light absorption differences promoted by the photoexposure allow the platemaker to distinguish readily the exposed from the non-exposed regions of the plate in advance of mounting and running the photoexposed plate on a printing press.

In addition, the operability of the polymeric photoresist may be improved by the addition of certain additives. For example, the polymeric photoresist can contain hardeners, or other agents to improve coatability. The polymeric photoresist may also contain antioxidant materials to prevent undesired (premature) polymerization and examples include derivatives of hydroquinone; methoxy hydroquinone; 2,6-di-(t-butyl)-4-methylphenol; 2,2'-methylene-bis-(4-methyl-6-t-butylphenol); tetrakis {-methylene-3-(3',5-di-t-butyl-4'-hydroxyphenyl)propionate} methane; diesters of thiodipropionic acid, triarylphosphite. While the use of such additives is unnecessary for the operability of the present invention, incorporation of such additives may dramatically enhance performance.

The contrast dyes, imaging dyes and other additives may be microencapsulated and incorporated into the photoresist itself or as a separate layer facially positioned or positionable atop the photoresist. Inclusion in microcapsules would provides a wider latitude in the selection of such additives, since neither the solubility of the additives in the photopolymerizable compositions nor the inhibition or retardation effect of some additives on polymerization would be an issue in such a system.

Development of a photoexposed plate of the invention can be accomplished in a number of ways, depending upon the particular nature of the photoresist employed. For example, in the case of negative-working photoresist based upon photopolymerizable ethylenically unsaturated monomers, conventional wet development can be employed using a diluted alkaline solution optionally containing up to 10% by volume of organic solvents. Examples of useful alkaline compounds include inorganic compounds such as sodium hydroxide, potassium hydroxide, lithium hydroxide, sodium benzoate, sodium silicate and sodium bicarbonate; and organic compounds such as ammonia, monoethanolamine, diethylanolamine and triethanoloamine. Water-soluble organic solvents useful as developers include isopropyl alcohol, benzyl alcohol, ethyl cellosolve, butyl cellosolve, diacetone alcohol and the like. Depending on particular needs, the developing solution may contain surfactants, dyes, salts for inhibiting the swelling of the photoresist, or salts for corroding the metal substrate.

As another means of development, it is noted that embodiments of the present invention may be operably on-press developed without any further treatment after exposure, development being accomplished on the printing press by the action of fountain solution and lithographic ink. In particular, using for example the methods of offset lithography, the printing plate plate can be mounted on a plate cylinder of the press which, as it rotates, comes into contact successively with rollers wet by a fountain solution and rollers wet by ink. The fountain and ink solution (sprayed or otherwise deposited onto dampening rollers and inking rollers, respectively) contacts the plate, leading to the afore-discussed interaction of the fountain and ink solutions with the plasticizing-permeation enhancing additive of the photoresist. Ultimately, the fountain solution contacts the non-printing areas of the plate and prevents ink from contacting these areas. The ink likewise contacts the image areas and is subsequently transferred to an intermediate blanket cylinder. The inked image is transferred to the recieving medium (e.g., paper) as it passes between the intermediate blanket cylinder and an impression cylinder.

While the on-press developable plates of the present invention are suitable for many printing applications, the plates can be improved in respect of on-press developability by suitably modifying the photoresist composition or treating the photoresist layer for improved removability on the press. For example, good results may be accomplished using the plasticizing-permeation enhancing system of the present invention in a photoresist that is in contact or brought into contact with the microencapsulated developer systems described in U.S. patent application Ser. No. 08/146,710, cross-referenced above. The photoresist may also incorporate a photoreactive polymeric binder and a dispersed, particulate rubber system, as described in the above cross-referenced U.S. Pat. No. 5,516,620 Nos. 08/147,045, and, respectively. See, Example 11, infra, for a representative example. The photoresist may also be protected by the overcoats decribed in the aforementioned U.S. patent application Ser. Nos. 08/430,359, and 08/430,876. Combination with these other on-press development systems is the suggested mode of utilization.

The present invention will now be described in further detail by the following non-limiting examples of several of its embodiments. Unless otherwise indicated, all parts, percents, ratios and the like are by weight.

EXAMPLES

Example 1

A base photoresist was made with the following percent solids:

| Component | % (Wt) |
|---|---|
| Elvacite 2042, poly(ethyl methacrylate) | 35.60 |
| Cab-o-sil M5 Silica | 1.00 |
| Sartomer 444, pentaerythrytol (pentaacrylate) | 26.98 |
| Trimethylolpropave triacrylate, TMPTA | 26.98 |
| Irgacure 651 (2,2-dimethoxy-2-phenylacetophenone from Ciba-Geigy)* | 8.43 |
| Irganox 1010 (tetrakis{methylene(3,5-di-tert-2-butyl-4-hydroxyhydrocinnamate)} from Ciba-Geigy)** | 0.50 |
| Irganox 1035 (thiodiethylene bis-(3,5-di-tert-butyl-4-hydroxy)hydrocinnamate from Ciba-Geigy)** | 0.50 |
| Methoxyhydroquinone, MEHQ*** | 0.13 |

Solvent: 50:50 mixture of Methyl Ethyl Ketone (MEK)/butanol to make 7% total solids.
*Photoinitiator.
**Antioxidant.
***Inhibitor.

The base photoresist could not be cleaned out with fountain solutions and ink alone. The base photoresist was mixed with various levels of N-methylpyrrollidone, NMP, as a model plasticizer. These solutions were coated onto several anodized uncoated aluminum lithographic printing plates (Resists 1–5) to a thickness of about 1 micron, and exposed with actinic radiation to a dose of 100 light units. Several of the best plates (i.e., Resist 3–5) were repeated, and stored overnight before exposing. The plates were then developed by hand, washing them first with fountain solution and then with RC-20 ink. The plasticizer levels and results are tabulated in the following table:

| Sample | % NMP | Storage t | % Highlights | % Shadows |
|---|---|---|---|---|
| Base Resist | *** | *** | *** | *** |
| Resist-1 | 1 | 0 hr | *** | *** |
| Resist-2 | 2.5 | 0 hr | 1% | 80% |

13
-continued

| Sample | % NMP | Storage t | % Highlights | % Shadows |
|---|---|---|---|---|
| Resist-3 | 5.0 | 0 hr | 0.5% | 70% |
| Resist-4 | 10 | 0 hr | 0.5% | 70% |
| Resist-5 | 15 | 0 hr | 0.5% | 70% |
| Resist-3 | 5.0 | 16 hr | 0.5% | 60% |
| Resist-4 | 10 | 16 hr | 0.5% | 80% |
| Resist-5 | 15 | 16 hr | 0.5% | 80% |

***No Clean Out

EXAMPLE 2

Two photoresist solutions were made with the following compositions (units given in wt % dry film):

| Component | 2A | 2B |
|---|---|---|
| Sartomer 973, urethane acrylate oligomer | 61.75 | 65.00 |
| Trimethylolpropane triacrylate, TMPTA | 2.75 | 2.88 |
| 1,6-hexanediol diacrylate | 23.75 | 25.00 |
| Irgacure 651 (from Ciba-Geigy) | 6.13 | 6.50 |
| Methoxyhydroquinone, MEHQ | 0.13 | 0.13 |
| Irganox 1010 (from Ciba-Geigy) | 0.25 | 0.25 |
| Irganox 1035 (from Ciba-Geigy) | 0.25 | 0.25 |
| Plasticizer: 1,2,6-trihydroxyhexane, THH | 5.00 | 5.00 |

These compounds were dissolved in a 50/50 mixture of methyl ethyl ketone and n-butanol. The solutions were each coated onto a lithographic aluminum substrate with a #6 Meyer rod, and dried at 80° C. for 3 minutes. The plates were then exposed at 100 light units on a standard graphic arts vacuum exposure frame with a UGRA graphic arts test mask. The plates were then developed by hand with a standard 5% alcohol fountain solution and RC-43 testing ink. Plate 2A gave a highlight dot retention of 4% and shadow dot clearance of 95%, with a maximum of 25 micron line cleanout. In contrast, Plate 1B exhibited noticeable background scumming; the shadow resolution was 90%, and the maximum shadow line resolution was 40 microns.

EXAMPLE 3

Three photoresist solutions of the following compositions (units given in wt% dry film) were deposited onto individual lithographic aluminum substrates in the same manner as Example 2:

| Component | 3A | 3B | 3C |
|---|---|---|---|
| Acryloid Resin A-11 (polymethylmethacrylate from Rohm & Haas) | 14.75 | 13.64 | 12.70 |
| Sartomer 973, urethane acrylate oligomer | 53.01 | 49.04 | 45.66 |
| Trimethylolpropane triacrylate, TMPTA | 22.74 | 21.02 | 19.57 |
| Cab-o-sil M5 Silica | 0.98 | 0.98 | 0.85 |
| Irgacure 651 (from Ciba-Geigy) | 6.39 | 5.91 | 5.50 |
| 2- and 4-isopropylthioxanthone, ITX | 1.50 | 1.50 | 1.50 |
| Methoxyhydroquinone, MEHQ | 0.13 | 0.13 | 0.13 |
| Irganox 1010 (from Ciba-Geigy) | 0.25 | 0.25 | 0.25 |
| Irganox 1035 (from Ciba-Geigy) | 0.25 | 0.25 | 0.25 |
| Plasticizer: 1,2,6-trihydroxyhexane, THH | 0.00 | 7.37 | 13.73 |

Plate 3A was exposed at 150 light units (LU) and developed in the same manner as Example 2. No cleanout of the non-imaged areas was observed. Plate 3B was exposed to 100 LU and developed with ink and fountain solution in the same manner, and yielded a highlight dot resolution of 1%, with shadow cleanout of 80%. In the same manner, Plate 3C was exposed at 150 LU and had a highlight resolution of 2% with a shadow resolution of 90%.

EXAMPLE 4

Several photoresists were made with the following dry film composition.

| Component | % (Wt.) |
|---|---|
| Acryloid Resin A 11 (from Rohm & Haas) | 13.46 |
| Uvithane 788, (urethane acrylate oligomer from Morton) | 48.39 |
| Trimethylolpropane triacrylate, TMPTA | 20.82 |
| Cab-o-sil M5 Silica | 0.90 |
| Pluronic 10-R5 (block copolymer of ethylene oxide and propylene oxide, HLB 15.0, from BASF) | 4.99 |
| Irgacure 651 (from Ciba-Geigy) | 5.83 |
| Methoxyhydroquinone, MEHQ | 0.12 |
| Irganox 1010 (from Ciba-Geigy) | 0.25 |
| Irganox 1035 (from Ciba-Geigy) | 0.25 |
| Plasticizer | 4.99 |

The plasticizers which were evaluated for this set of experiments were propylene glycol diacetate, PGDA; 1,2,6-trihydroxyhexane, THH; triethylene glycol diacetate, 3EGDA; Plasthall 7050, P7050 (dialkylalkylene glutarate, from C. P. Hall Co.); Tegmer 809, T809 (polyethylene glycol di-2ethylhexoate, from C. P. Hall Co.); Hallco C-410 (a mixture of glycerol acetates and glycerol, from C. P. Hall Co.); Plasthall 224 (dibutoxyethoxy ethyl glutarate, from C. P. Hall Co.); and Hallcomid M-8-10 (N,N-dimethylamide caprylamide caparamide, from C. P. Hall Co.). The formulations were made in an 8% solution in a solvent mixture comprising 21.7% of n-butanol and 78.3% methyl ethyl ketone. The solutions were each deposited onto a lithographic aluminum substrate with a #6 Meyer rod and dried at 80° C. These plates were exposed and developed in the same manner as the previous examples. The results are tabulated in Table 1 below:

TABLE 1

Plasticizer Screening Series

| Plasticizer | Exposure | Observed Results |
|---|---|---|
| PGDA | 100 | Did not clean out easily |
| THH | 100 | Cleaned out easily |
| 3EGDA | 100 | Cleaned out easily |
| P7050 | 100 | Cleaned out with difficulty |
| T809 | 100 | Cleaned out with difficulty |
| Hallco C-410 | 100 | Did not clean out |
| Plasthall 224 | 100 | Did not clean out |
| Hallcomid M-8-10 | 100 | Did not clean out |
| No Plasticizer | 100 | Did not clean out |

3EGDA yielded the best combination of highlight and shadow resolution with comparable dosage and gel speed. The others cleaned out with more difficulty; the plates using PGDA, Hallco C-410, Plasthall 224, Hallcomid M-8-10, and the formulation without plasticizer did not clean out.

EXAMPLE 5

To a quantity of the formulation using P7050 in Example 4 was added a sufficient amount of a 5% lithium chloride solution in 50/50 MEK/n-butanol to yield a nearly identical coating which was 2% lithium chloride in dry film solids.

The plate was coated, exposed, and developed in the same manner as the previous example, and the shadow resolution was improved to 95%. In contrast, the P7050 plate from Example 4 only produced 50% shadow resolution, and showed considerable scumming in the non-imaged areas.

EXAMPLE 6

Two photoresist were prepared with the following dry film compositions:

| Component | 6A (wt %) | 6B (wt %) |
|---|---|---|
| Acryloid Resin A-11 (polymethylmethacrylate Rohm and Haas) | 6.50 | 6.50 |
| Acryloid Resin B-72 (poly(ethylmethacrylate-co-methylacrylate) from Rohm and Haas) | 17.00 | 17.00 |
| Uvithane 788, urethane acrylate oligomer (Morton) | 8.78 | 8.00 |
| Ebecryl 8301 Oligomer (Radcure)* | 32.58 | 29.67 |
| Trimethylolpropane Triacrylate, TMPTA | 14.48 | 13.19 |
| Cab-o-sil M5 Silica | 0.80 | 0.80 |
| 2,2'-bis(o-chlorophenyl)-4,4',5,5'-tetraphenyl-1,2'-biimidazole** | 3.50 | 3.50 |
| Quantacure BMS | 1.80 | 1.80 |
| 3-benzoyl-7-methoxycoumarin | 1.40 | 1.40 |
| Diphenyl Phosphate, DPP | 2.00 | 2.00 |
| 2,6-diisopropyl-N,N-dimethylaniline, DIDMA*** | 2.20 | 2.20 |
| Leuco Crystal Violet | 2.77 | 2.77 |
| 2,6-di-tert-butyl-4-methylphenol, BHT | 0.14 | 0.14 |
| Irganox 1035 (Ciba-Geigy) | 0.10 | 0.10 |
| LiCl | 0.50 | 0.61 |
| Plasticizer: 3EGDA | 5.00 | 5.00 |
| Pluronic L43 Surfactant (block copolymer of ethylene oxide and propylene oxide, HLB 12, from BASF) | 0.00 | 5.00 |

*Ebecryl 8301 is a hexafunctional urethane acrylate oligomer.
**Radical co-initiator.
***Antioxidant.

These compositions were made as 4.6% solutions in solvent mixtures which were 7.45 parts n-butanol, 7.2 parts toluene, 7.2 parts cyclohexanone, and 92.63 parts MEK. The solutions were spin-coated onto aluminum substrates at a spin rate of 150 rpm, allowed to spin for 45 seconds, and dried for 3 minutes at 70° C. The plates were then exposed in the same manner as the previous examples, but with a dosage of 80 light units. Plate 6A could not be developed by rubbing with ink and fountain solution. Plate 6B developed to form a discernible image with a clean background.

EXAMPLE 7

A base photoresist solution was made according to the following formulation:

| Component | % (Wt) |
|---|---|
| Acryloid Resin A-11 (from Rohm & Haas) | 16.15 |
| Acryloid Resin B-72 (from Rohm & Haas) | 5.38 |
| Cab-o-sil M5 Silica | 3.40 |
| Radcure 8301, hexafunctional urethane acrylate | 30.58 |
| Uvithane 788, urethane acrylate oligomer (from Morton) | 10.83 |
| Trimethylolpropane triacrylate, TMPTA | 16.10 |
| 2,2'-bis(o-chlorophenyl)-4,5,4',5'-tetraphenyl-1,2'-biimidazole | 3.55 |
| p-toluenesulphonic acid, PTSA | 0.87 |
| Quantacure BMS (4-benzyl-4'-methyldiphenyl sulfide from International Biosynthetics LTD, Chesire, UK) | 4.73 |
| 2-isopropyl thioxanthone, ITX | 0.87 |
| 2,6-diisopropyl-N,N-dimethylaniline, DIDMA | 3.77 |
| Leuco Crystal Violet Dye | 3.20 |
| Irganox 1035 (from Ciba-Geigy) | 0.19 |
| Methylhydroquinone, MEHQ | 0.12 |

The base photoresist was diluted to 10% solids in a mixture of 15% butanol and 85% methyl ethyl ketone, MEK. 50 grams of this mixture was added to stock solutions of Pluronic L43, LiCl, 4EGDA, and 4EGDP so that the final solids content of the coating was that in the table below. The solution were then spin coated onto aluminum plates in the same manner as the plates in the last example and run on a Multigraphics printing press. The table below lists the lithium salt, plasticizer, and surfactant content of each plate, and its performance on press as measured from a printed glossy sheet at 1000 impressions.

| % LiCl | % 4EGDA | % 4EGDP | % L43 | Step Dmax | % Highlight | % Shadow Dot |
|---|---|---|---|---|---|---|
| 0.1 | 0.00 | 4.95 | 4.95 | 5 | 4 | 80 |
| 0.1 | 4.95 | 0.00 | 4.95 | 5 | 3 | 80 |
| 0.5 | 0.00 | 4.75 | 4.75 | 5 | 3 | 80 |
| 0.5 | 4.75 | 0.00 | 4.75 | 6 | 3 | 80 |
| 0.9 | 0.00 | 4.55 | 4.55 | 7 | 3 | 80 |
| 0.9 | 4.55 | 0.00 | 4.55 | 8 | 3 | 80 |

As evident from the above table, both plasticizers interact well with L43 and LiCL. The results also reveal a correlation between increasing lithium content and increased photo-speed.

EXAMPLE 8

The base photoresist formula used in Example 7 was used in the present example except that butyrated hydroxytoluene (BHT) was substituted for MEHQ.

The photoresist solution was diluted to 4% solids with stock solutions of the plasticizer, pluronic L43 and LiCl, and a 50:50 mixture of MEK and butanol, such that the concentration of plasticizer, surfactants, lithium chloride in the dry coating were at the concentrations set forth in the table below. The solutions were each coated onto a 22"×26⅜" anodized aluminum plate, allowed to stand overnight, and run on a Komori single color printing press. The values for exposure, highlight and shadow resolution at 1000 impressions, and highlight lifetime, were all read directly from the printed image on glossy paper. Highlight lifetime was defined as the run length of 5% dots. The exposure was 120 light units. The results are tabulated as follow:

| % LiCl | % 4EGDA | % 4EGDP | % L43 | Step Dmax | Highlight | % Shadow Dot | Highlight Lifetime |
|---|---|---|---|---|---|---|---|
| 0.50 | 6.00 | 0.00 | 5.00 | 6 | 4 | 80 | 11700 |
| 1.30 | 6.06 | 3.43 | 1.00 | 5 | 4 | 80 | 1700 |
| 1.25 | 5.40 | 5.10 | 1.00 | 9 | 4 | 80 | 18700 |
| 1.30 | 4.80 | 5.10 | 1.20 | 7 | 3 | 80 | 23700 |

The best run length was for a diacetate/dipropionate balance of about 1 or less.

EXAMPLE 9

A base photoresist formula was made with a composition similar to Example 7, except that it included 4.5% each of 4EGDA and 4EGDP, and 1% Pluronic L43 by weight. The base photoresist formula was used to prepare several photoresist solutions with varying percentages of lithium nitrate and lithium chloride as listed in the table below. The lithium nitrate and chloride contents were chosen such that the combination of the two was always 1% solids. The solutions were made to 4% solids by weight, and spin coated onto an anodized aluminum substrate at 150 rpm. The plates were dried as before, stored overnight, exposed to 80 LU on a Teaneck Graphics exposure frame using a UGRA exposure mask, and then run to 1000 impressions on a Multigraphics form press. Data for the resolution and dye density on the plate are as follows:

| % Nitrate* | Microlines, μm | % Shadows | % Highlights | Dye Density |
|---|---|---|---|---|
| 0 | 30 | 95 | 3 | — |
| 10 | 25 | 95 | 3 | — |
| 15 | 25 | 95 | 4 | 0.65 |
| 25 | 20 | 95 | 5 | 0.67 |
| 50 | 25 | 95 | 5 | 0.70 |
| 75 | 20 | 95 | 5 | 0.73 |
| 90 | 20 | 95 | 5 | 0.73 |

*percent nitrate in 1.0% total lithium salt.

It was observed that for the range of 0.25–0.9% lithium nitrate the nitrate salt appeared to be comparable to the chloride salt as a development aid, as well as promoting higher dye density in the visible image. It was further observed that there was less background dye density as the percentage of nitrate was increased relative to the chloride salt.

EXAMPLE 10

Five image coat formulations were prepared with the following dry film compositions (units given in wt % dry film):

| Component | 10A | 10B | 10C | 10D | 10E |
|---|---|---|---|---|---|
| Acryloid Resin A-11 (Rohm & Haas) | 14.25 | 14.25 | 14.25 | 14.25 | 14.25 |
| Acryloid Resin B-72 (Rohm & Haas) | 3.96 | 3.96 | 3.96 | 3.96 | 3.96 |
| Uvithane 788, urethane acrylate oligomer | 10.42 | 10.42 | 11.57 | 11.41 | 10.53 |
| Ebecryl 8301 Oligomer (Radcure) | 30.73 | 30.73 | 34.11 | 33.65 | 31.06 |
| Trimethylolpropane Triacrylate, TMPTA | 15.63 | 15.63 | 17.35 | 17.12 | 15.80 |
| Cab-o-sil M5 Silica | 1.03 | 1.03 | 1.03 | 1.03 | 1.03 |
| 2,2'-bis(o-chlorophenyl)4,4',5,5'- tetraphenyl-1,2-biimidazole | 3.25 | 3.25 | 3.25 | 3.25 | 3.25 |
| Quantacure BMS | 0.82 | 0.82 | 0.82 | 0.82 | 0.82 |
| 2- and 4-isopropylthioxanthone, ITX | 0.73 | 0.73 | 0.73 | 0.73 | 0.73 |
| p-toluenesulfonic acid, PTSA | 0.82 | 0.82 | 0.82 | 0.82 | 0.82 |
| 2,6-diisopropyl-N,N-dimethyl- aniline, DIDMA | 3.46 | 3.46 | 3.46 | 3.46 | 3.46 |
| Leuco Crystal Violet | 3.06 | 3.06 | 3.06 | 3.06 | 3.06 |
| Methylhydroquinone, MEHQ | 0.40 | 0.40 | 0.40 | 0.40 | 0.40 |
| LiCl | 0.61 | 0.61 | 0.61 | 0.61 | 0.61 |
| Plasticizer, 4EGDA | 6.25 | 0.00 | 0.00 | 6.25 | 6.25 |
| Plasticizer, 4EGDP | 0.00 | 6.25 | 0.00 | 0.00 | 0.00 |
| Pluronic L43 Surfactant | 5.39 | 5.39 | 5.39 | 0.00 | 5.39 |

These compositions were made as 4% solutions in a solvent mixtures comprising 37.5 parts n-butanol and 82.7 parts methyl ethyl ketone, MEK. The solutions were spin-coated onto an aluminum substrate at a spin rate of 150 rpm, allowed to spin for 45 seconds, and dried for 3 minutes at 70° C. The plates were then run on a MultiGraphics offset press. In the case of Plates 10A and 10B (each containing a plasticizer, LiCl and a surfactant), high contrast images with a clean background were observed after 5–10 impressions. Plates 10C (no plasticizer) and 10D (no surfactant) did not show on-press developability; plate 10E (no LiCl) did develop, but with significantly lower shadow resolution than plate 10A.

EXAMPLE 11

A photoresist solution with 7% of solid was made according to the formulation set forth below. Triethylene glycol diacetate was used for the plasticizer component.

| Component | % (w/w) |
|---|---|
| Photoreactive Acrylic Binder* | 51.75 |
| Ebecryl 8301 oligomer (Radcure) | 17.42 |
| Trimethylolpropane triacrylate | 4.68 |
| Polyurethane PU788 (Morton) | 7.74 |
| Acrylated Nitrile Butadiene (Hycar 1300x33, B F Goodrich) | 4.00 |
| 3-benzoyl-7-methoxy coumarin** | 1.40 |
| 4-benzoyl-4-methyl diphenyl sulfide** | 1.80 |
| 2-phenyl-4,6-bis-(trichloromethyl-5-triazine)** | 2.21 |
| Triethylene glycol diacetate | 3.50 |
| Leuco Crystal Violet Dye | 2.77 |
| 2,6-di-tert-butyl-4-menthyl phenol (BHT)*** | 0.13 |
| Irganox 1035 (Ciba-Geigy) | 0.10 |
| Pluronic L43 Surfactant (BASF) | 2.50 |

*The photoresist binder contained methyl methacrylate, butyl methacrylate, maleic anhydride, and m-TMI adduct with hydroxybutyl acrylate. See, U.S. Pat. applications Ser. Nos. 08/147,045 and 08/146,711, cross-referenced above.
** Radical initiator.
***Antioxidant.

The photoresist composition was coated onto an anodized aluminum plate by continuous roll coating, exposed to actinic radiation, then on-press developed. On-press development of the photoresist was effectuated by the agency of high-boiling, low-vapor pressure developers liberated from ruptured microcapsules coated atop the photoresist.

The microcapsules were prepared by first dissolving 8.0 g HEC 330 PA (hydroxyethylcellulose from Hercules), 3.9 g Versa TL 502 (polystyrene sulfonate from National Starch), 0.06 g Aerosol TO (dialkylester of sodium sulfosuccinic acid from Fisher) in 425 g H20. A mixture of 21.5 g gamma nonalactone, 89.5 g dibutyl phthalate, and 11.1 g Desmodur N-100 (polyisocyanate from Miles) was then dispersed into the aqueous phase at 1500 rpm for 10 minutes. To encourage the formation of prewall, a small amount of dibutyl tin dilaurate (0.12 g) was added into the oleophilic phase. 1.4 g of triethylene tetramine was added and allowed to react for 2 hours at room temperature. 41.1 g of a melamine-formaldehyde prepolymer (CYMEL 385, from American Cyanamid) was added and the pH adjusted to between 5 and 5.5 with 1N sulfuric acid. The reaction was continued at 65° C. for one hour. 10.0 gs of urea were added to react for one hour to quench all residual formaldehyde and/or melamineformaldehyde condensate in the mixture. Sodium Chloride (18.3 g) was added and the pH was brought to 9 and the reaction allowed to continue for 30 minutes, then slowly cooled to 25° C. The microcapsules were washed extensively with deionized water in a centrifuge.

A microcapsule-containing coating solution was subsequently prepared utilizing 9.45 g microcapsules (at 39.7% w/v), 0.47 g Silica 2040 (at 40% w/v), 1.13g PVA 205 (at 10% w/v), 2.24 g Pluronic L43 surfactant (at 5% w/v); Tx100 surfactant (at 10% w/v), 0.06 g LiCl (at 2% w/v) and 11.47 g H₂O.

The microcapsule-containing coating solution was coated atop the photoresist. After exposing the plate to 40 UV light units, the plate was run through a pressure roller then mounted and ran on a Multigraphics 1250 lithographic printing press. The plate on-press developed within 20 impressions.

We claim:

1. A lithographic printing plate developable on a lithographic printing press equipped with means for delivering lithographic ink and aqueous fountain solutions to the printing plate, the lithographic printing plate having in order
   (a) a hydrophilic, oleophobic printing plate substrate; and
   (b) a hydrophobic, oleophilic, organic solvent-deposited photoresist photohardenable upon imagewise exposure to actinic radiation, the photoresist comprising
      (i) a water-insoluble macromolecular organic binder;
      (ii) a photopolymerizable ethylenically unsaturated monomer having at least one terminal ethylenic group capable of forming a high polymer by chain-propagated polymerization,
      (iii) a polymerization initiator activatable by actinic radiation, and
      (iv) a plasticizing-permeation enhancing additive in a concentration sufficient to enhance penetration or diffusion of lithographic ink and aqueous fountain solutions into non-photohardened areas of the photoresist when the photoresist is imagewise exposed and said solutions are delivered to the printing plate by said means in said lithographic printing press, the plasticizing-permeation enhancing additive having a solubility or dispersibility in said acidic aqueous fountain solution such that the additive is also capable of being contemporaneously leached out of photohardened areas of the photoresist by said solutions delivered to the printing plate by said means in said lithographic printing press, the plasticizing-permeation enhancing additive having a Hildebrand Solubility value between approximately 10 $[cal/cm^3]^{1/2}$ and approximately 23 $[cal/cm^3]^{1/2}$: and
      (v) a lithium salt.

2. The lithographic printing plate of claim 1, wherein the plasticizing-permeation enhancing additive is soluble in a composition from which the photoresist is coated and soluble or dispersible in said lithographic ink and fountain solutions.

3. The lithographic printing plate of claim 1, wherein the ethylenically unsaturated monomer or the macromolecular organic binder has a functional group capable of forming hydrogen bonds, and the lithium salt is capable of disrupting hydrogen bonding by said functional group.

4. The lithographic printing plate of claim 3, wherein the lithium salt is lithium chloride.

5. The lithographic printing plate of claim 3, wherein the lithium salt is lithium nitrate.

6. The lithographic printing plate of claim 1, wherein the plasticizing-permeation enhancing additive is 1,2,6-trihydroxyhexane.

7. The lithographic printing plate of claim 1, wherein the plasticizing-permeation enhancing additive is triethylene glycol diacetate.

8. The lithographic printing plate of claim 1, wherein the plasticizing-permeation enhancing additive is tetraethylene glycol dipropionate.

9. A method of lithographically printing images on a receiving medium, the method utilizing a printing press equipped with means for delivering lithographic ink and aqueous fountain solutions to a printing plate mounted therein, the method comprising in order the steps of:
   (a) incorporating a plasticizing-permeation enhancing additive into an organic solvent-based photoresist composition, wherein
      (i) the organic solvent-based photoresist composition comprises a water-insoluble macromolecular organic binder; a photopolymerizable ethylenically unsaturated monomer having at least one terminal ethylenic group capable of forming a high polymer by chain-propagated polymerization, and a polymerization initiator activatable by actinic radiation, and
      (ii) the plasticizing-permeation enhancing additive is incorporated in a concentration sufficient to enhance penetration or diffusion of lithographic ink and aqueous acidic fountain solutions into non-photohardened areas of a resulting photoresist when said solutions are delivered to the printing plate by said means in said lithographic printing press, the plasticizing-permeation enhancing additive having a solubility or dispersibility in said acidic aqueous fountain solution such that the additive is also capable of being contemporaneously leached out of photohardened areas of the photoresist by said solutions delivered to the printing plate by said means in said lithographic printing press, the plasticizing-permeation enhancing additive having a Hildebrand Solubility value between approximately 10 $[cal/cm^3]^{1/2}$ and approximately 23 $[cal/cm^3]^{1/2}$.
   (b) depositing the photoresist composition onto a hydrophilic, oleophobic lithographic printing plate substrate, to provide thereon a hydrophobic, oleophilic photoresist capable of being photohardened upon imagewise exposure to actinic radiation;
   (c) imagewise exposing the photoresist to actinic radiation to cause the photopolymerizable monomer in exposed areas to polymerize and thereby cause exposed areas of the photoresist to imagewise photoharden, unexposed areas being removable by press fountain and ink solutions; then (d) treating the photoresist with lithographic ink and aqueous fountain solutions in said printing press, wherein the ink and fountain solutions penetrate or diffuse into the photoresist to thereby effect removal of non-photohardened areas of the photoresist correspondingly baring the underlying substrate, and wherein the ink and fountain solutions leach out the plasticizing-permeation enhancing additive in photohardened areas contemporaneously with said removal of said non-photohardened areas, and whereby ink becomes imagewise localized in either unremoved photoresist or bared substrate to form an imagewise distribution of said ink, said ink being transferable to a receiving medium.

10. The method of claim 9, wherein said photoresist composition further comprises a lithium salt.

11. The method of claim 10, wherein the ethylenically unsaturated monomer or the macromolecular organic binder has a functional group capable of forming hydrogen bonds, and the lithium salt is capable of disrupting hydrogen bonding by said functional group.

12. The method of claim 11, wherein the lithium salt is lithium chloride.

13. The method of claim 11, wherein the lithium salt is lithium nitrate.

14. The method of claim 9, wherein the plasticizing-permeation enhancing additive is soluble in the solvent-based photoresist composition and soluble or dispersible in said lithographic ink and fountain solutions.

15. The method of claim 9, wherein the plasticizing-permeation enhancing additive is 1,2,6-trihydroxyhexane.

16. The method of claim 9, wherein the plasticizing-permeation enhancing additive is triethylene glycol diacetate.

17. The method of claim 9, wherein the plasticizing-permeation enhancing additive is tetraethylene glycol dipropionate.

* * * * *